United States Patent
Kajigaya et al.

(10) Patent No.: US 7,713,511 B2
(45) Date of Patent: May 11, 2010

(54) LITHIUM TANTALATE SUBSTRATE AND PROCESS FOR ITS MANUFACTURE

(75) Inventors: Tomio Kajigaya, Hokkaido (JP); Takashi Kakuta, Hokkaido (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 812 days.

(21) Appl. No.: 10/574,277

(22) PCT Filed: Oct. 7, 2004

(86) PCT No.: PCT/JP2004/015191

§ 371 (c)(1),
(2), (4) Date: Mar. 31, 2006

(87) PCT Pub. No.: WO2005/038098

PCT Pub. Date: Apr. 28, 2005

(65) Prior Publication Data

US 2007/0122337 A1 May 31, 2007

(30) Foreign Application Priority Data

Oct. 16, 2003 (JP) .............................. 2003-356518

(51) Int. Cl.
*C01G 31/02* (2006.01)
*C01D 1/02* (2006.01)
(52) U.S. Cl. ................. 423/594.8; 423/594.15
(58) Field of Classification Search ............ 423/594.15, 423/594.8
See application file for complete search history.

(56) References Cited

U.S. PATENT DOCUMENTS 6,282,356 B1 * 8/2001 Johnston et al. ............ 385/129

FOREIGN PATENT DOCUMENTS

| JP | 53-9279 | 1/1978 |
|----|---------|--------|
| JP | 57-3800 | 1/1982 |
| JP | 63-35499 | 2/1988 |
| JP | 6-37350 | 5/1994 |
| JP | 6-191983 | 7/1994 |
| JP | 11-92147 | 4/1999 |
| JP | 11-236298 | 8/1999 |
| JP | 2004-315316 | 11/2004 |
| JP | 2004-328712 | 11/2004 |
| JP | 2005-206444 | 8/2005 |

OTHER PUBLICATIONS

A.A. Ballman; "Growth of Piezoelectric and Ferroelectric Materials by the Czochralski Technique;" *Journal of The American Ceramic Society—Discussions and Notes*; vol. 48; No. 2; Mar. 31, 1964; p. 112./Discussed in the specification.

* cited by examiner

*Primary Examiner*—Stanley Silverman
*Assistant Examiner*—James Fiorito
(74) *Attorney, Agent, or Firm*—Kratz, Quintos & Hanson, LLP

(57) ABSTRACT

A lithium tantalate substrate obtained by working in the state of a substrate a lithium tantalate crystal grown by the Czochralski method is buried in a mixed powder of Al and $Al_2O_3$, followed by heat treatment carried out at a temperature kept to from 350 to 600° C., to manufacture a lithium tantalate substrate having volume resistivity which has been controlled within the range of from $10^{10}$ to $10^{13}$ Ωcm. The substrate obtained has a very low pyroelectricity or no pyroelectricity, and it can be made colored and opaque from a colorless and transparent state and also sufficiently has the properties required as a piezoelectric material.

4 Claims, No Drawings

LITHIUM TANTALATE SUBSTRATE AND PROCESS FOR ITS MANUFACTURE

TECHNICAL FIELD

This invention relates to a lithium tantalate (LT) substrate used in surface acoustic wave devices and the like, and is more particularly concerned with improvements in an LT substrate which can not easily cause a lowering of yield in device fabrication processes and also has properties required as piezoelectric materials, and in a process for manufacturing the same.

BACKGROUND ART

Lithium tantalate (LT) crystals are ferroelectric materials having a melting point of about 1,650° C. and a Curie temperature of about 600° C. Then, LT substrates are chiefly used as materials for surface acoustic wave (SAW) filters used to remove signal noise of cellular telephones.

It is predicted that a SAW filter having a frequency region of about 2 GHz hereafter increases rapidly because, e.g., cellular telephones are being made high-frequency and Bluetooth (2.45 GHz), which is a cordless LAN of electronic equipment of various types, has prevailed.

Such a SAW filter has a structure in which a pair of comb-shaped electrodes are formed of metallic thin films of an AlCu alloy or the like on a substrate constituted of a piezoelectric material such as LT. Such comb-shaped electrodes play an important role that governs the polarity of devices. Also, the comb-shaped electrodes are made up by forming metallic thin films on the piezoelectric material by sputtering, thereafter leaving a pair of comb-shaped patterns, and removing unnecessary portions by etching using a photolithographic technique.

In order to make the filter adaptable to higher frequency, the comb-shaped patterns must finely and also thinly be formed. In devices of about 2 HGz in frequency, the filter has an electrode-to-electrode distance of 0.3 to 0.4 μm which is about ⅓ of that of currently prevalent devices of 800 MHz in frequency, and a thickness of about 200 nm or less which is ⅕ or less of the same.

The LT single crystal is, in an industrial scale, usually chiefly obtained by the Czochralski method, using an iridium crucible having a high melting point, and is grown in an electric furnace having an atmosphere of a nitrogen-oxygen mixed gas of several to about 10% in oxygen concentration, then cooled in the electric furnace at a stated cooling rate, and thereafter taken out of the electric furnace (see Albert A. Ballman, Journal of American Ceramic Society, Vol. 48, 1965).

The LT crystal thus grown is colorless and transparent or has a highly transparent pale yellow color. After it has been grown, it is subjected to heat treatment at an soaking temperature close to the melting point in order to remove the residual strain produced by thermal stress of the crystal, and further to poling treatment so as to be single-polarized, i.e., a series of treatment in which the LT crystal is heated from room temperature to a stated temperature of Curie temperature or more, a voltage is applied to the crystal, and, keeping the voltage applied, the crystal thus heated is cooled to a stated temperature of Curie temperature or less, and thereafter, stopping the voltage being applied, cooled to room temperature. After the poling treatment, the LT crystal the periphery of which has been ground in order to make the crystal have a proper shape (an ingot) is put to mechanical working such as slicing, lapping and polishing steps, and made into the LT substrate. The LT substrate obtained finally is substantially colorless and transparent, and has a volume resistivity of about $10^{14}$ to $10^{15}$ Ωcm.

Now, in the LT substrate obtained by such a conventional method, it may come about that, because of sparks generated in a process of fabricating a surface acoustic wave device when the substrate surface is charged up due to temperature changes undergone during the process, on account of the pyroelectricity that is a property of the LT crystal, patterns formed on the substrate surface are destroyed and further the substrate is broken to cause a lowering of yield in the device fabrication process.

There also arises a problem that, since the LT substrate has a high light transmittance, the light transmitted through the interior of the substrate in the step of photolithography that is one step in the device fabrication process reflects from the back of the substrate and returns to the surface to make poor the resolution of the patterns formed.

Accordingly, in order to solve such problems, as disclosed in Japanese Patent Applications Laid-open No. H11-92147 and No. H11-236298, it is proposed to expose a lithium niobate (LN) crystal to a reducing atmosphere (stated specifically an atmosphere of a gas selected from argon, water, hydrogen, nitrogen, carbon dioxide, carbon monoxide, oxygen, and combination of any of these) in the range of 500 to 1,140° C. to blacken a wafer of LN crystal so that the substrate can be kept from having a high light transmittance and also it can have a high electrical conductivity to thereby keep the light from returning from the back of the substrate and at the same time make the substrate have a low pyroelectricity.

However, the invention disclosed in the publications Japanese Patent Applications Laid-open No. H11-92147 and No. H11-236298 is intended not only for the LN crystal but also the lithium tantalate (LT) crystal, but these publications Japanese Patent Applications Laid-open No. H11-92147 and No. H11-236298 have substantially no disclosure at all as to the LT crystal. Then, experiments made by the present inventors have confirmed that the method disclosed therein is effective in respect of the lithium niobate crystal, having a melting point of as low as about 1,250° C., but not effective in respect of the LT crystal, having a melting point of as high as 1,650° C.

Under such a technical background, the present inventors have already proposed a method quite different from the method disclosed in the publications Japanese Patent Applications Laid-open No. H11-92147 and No. H11-236298, i.e., a method in which the LT crystal is buried in a metallic powder of a metal selected from the group consisting of Ca, Al, Ti and Si (what is called a reducing agent) and this is subjected to heat treatment at a temperature kept to 350 to 600° C. to manufacture the lithium tantalate (LT) substrate (see the specification in Japanese Patent Application No. 2003-104176).

The LT substrate manufactured by this method, like the lithium niobate (LN) substrate disclosed in the publications Japanese Patent Applications Laid-open No. H11-92147 and No. H11-236298, can be kept from having a high light transmittance and also can have a high electrical conductivity. Hence, in the lithium tantalate (LT) substrate as well, it enables solution of the above problems of a lowering of yield in the device fabrication process and of making poor the resolution of the patterns formed.

However, the invention disclosed in the specification in Japanese Patent Application No. 2003-104176, has a problem that, if the reducing conditions in respect of the lithium tantalate (LT) substrate are too strong, the LT substrate obtained may have a very low pyroelectricity and hence the problem to be caused by the charge-up can be remedied, but the LT substrate may also similarly have a low piezoelectricity to have low properties required as a piezoelectric material, and has a problem that, if on the other hand the reducing conditions in respect of the lithium tantalate (LT) substrate are too weak, it is difficult for the LT substrate obtained to have a low pyroelectricity. Thus, there has been room for further improvement.

DISCLOSURE OF THE INVENTION

The present invention has been made taking note of such problems, and what the present invention regards as its subject is to provide a lithium tantalate (LT) substrate which has solved the problem to be caused by the charge-up of the substrate and also sufficiently has the properties required as a piezoelectric material; and a process for manufacturing such a substrate.

Accordingly, in order to settle the above subject, the present inventors have continued their extensive studies. As a result, they have discovered that, where the lithium tantalate (LT) substrate has volume resistivity which has been controlled within the range shown below, this LT substrate solves the problem to be caused by the charge-up and moreover sufficiently has the properties required as a piezoelectric material, and also that this LT substrate may be obtained by burying an LT crystal in a mixed powder of Al and $Al_2O_3$, followed by heat treatment carried out at a temperature kept to from 350 to 600° C.

That is, the lithium tantalate (LT) substrate according to the present invention is characterized by having volume resistivity which has been controlled within the range of from $10^{10}$ to $10^{13}$ Ωcm.

The process for manufacturing the lithium tantalate substrate according to the present invention is a process for manufacturing a lithium tantalate substrate by using a lithium tantalate crystal grown by the Czochralski method, wherein a lithium tantalate crystal worked in the state of a substrate is buried in a mixed powder of Al and $Al_2O_3$, followed by heat treatment carried out at a temperature kept to from 350 to 600° C., to manufacture a lithium tantalate substrate having volume resistivity which has been controlled within the range of from $10^{10}$ to $10^{13}$ Ωcm.

In the lithium tantalate (LT) substrate according to the present invention, its resistivity is controlled within the range of from $10^{10}$ to $10^{13}$ Ωcm. Hence, the substrate has a very low pyroelectricity or no pyroelectricity, and it can be made colored and opaque from a colorless and transparent state and also sufficiently has the properties required as a piezoelectric material. Therefore, it no longer comes about that, e.g., because of sparks generated when the substrate surface is charged up due to temperature changes undergone during the process of fabricating a surface acoustic wave device or the like, patterns formed on the substrate surface are destroyed and further the substrate is broken. It also no longer comes about that the light transmitted through the interior of the substrate in the step of photolithography reflects from the back of the substrate and returns to the surface to make poor the resolution of the patterns formed.

BEST MODES FOR PRACTICING THE INVENTION

The present invention is described below in detail.

In the first place, the LT crystal changes in electrical conductivity and color depending on the density of oxygen holes (vacancies) present in the crystal. Upon introduction of oxygen holes into the LT crystal, the valence of some Ta ions changes from 5+ to 4+ because of the necessity of balancing charges, to produce electrical conductivity and at the same time bring about absorption of light.

The electrical conductivity is considered to be produced because the electrons that are carriers move between $Ta^{5+}$ ions and $Ta^{4+}$ ions. The electrical conductivity of a crystal depends on the product of the number of carriers per unit volume and the mobility of carriers. If the mobility is invariable, the electrical conductivity is proportional to the number of oxygen holes. The change in color due to the absorption of light is considered to depend on the level of electrons introduced by the oxygen holes.

The number of oxygen holes may be controlled by heat treatment making use of what is called a reducing agent, utilizing the solid-to-solid equilibrium. Then, in the present invention, as the reducing agent for the LT crystal, Al (aluminum) is used. Stated specifically, a material LT substrate is buried in a mixed powder of Al and $Al_2O_3$, in the state of which the heat treatment is carried out.

The heat treatment may preferably be carried out in an atmosphere of an inert gas such as nitrogen gas or argon gas, or vacuum or the like, in order to prevent deterioration due to any excess oxidation of the Al (aluminum) itself constituting the powder. Also, the temperature of the heat treatment may preferably be a high temperature. Its upper limit is limited to the Curie temperature of the LT crystal so that the LT substrate having been made single-polarized by the poling treatment may not come multi-polarized.

As conditions most preferable taking account of the controllability of treating steps, the properties of the substrate to be finally obtained, the uniformity of that properties, the reproducibility and so forth, it is effective to use as a material a wafer (material LT substrate) cut out of an LT crystal ingot having been subjected to poling, and bury the material LT substrate in the mixed powder of Al and $Al_2O_3$, followed by heat treatment carried out at the Curie temperature or below of the LT crystal and in the atmosphere of an inert gas such as nitrogen gas or argon gas, or vacuum or the like. Incidentally, when carried out in an atmosphere of vacuum, the conditions for reduction may be too strong, and, when carried out in an atmospheric-pressure atmosphere of an inert gas, it takes a long time to effect the reduction. Hence, it is more preferable for the heat treatment to be carried out in a reduced-pressure atmosphere of an inert gas (such as nitrogen gas or argon gas).

The LT crystal also has strong bond ionic properties and hence the holes diffuse at a relatively high rate. However, in-crystal diffusion of oxygen is required for the change in the density of oxygen holes, and hence the crystal must be kept in an atmosphere for a certain time. The rate of such diffusion depends greatly on the temperature, and the oxygen hole density does not change in actual time in the vicinity of room temperature. Accordingly, in order that an LT substrate having the desired properties is obtained in a short time, the material LT substrate must be kept at a temperature high enough to achieve a sufficient oxygen diffusion rate, and in an atmosphere of a low oxygen concentration.

After treatment at the high temperature, the LT substrate thus treated may immediately be cooled, whereby a crystal having kept the density of oxygen holes introduced at the high temperature can be obtained at room temperature. The lower limit of treatment time may experimentally be determined with ease according to the treatment temperature in the above heat treatment process, taking account of economical advantages.

Now, the pyroelectric effect (pyroelectricity) is ascribable to the deformation of lattices that is caused by changes in crystal temperature. In crystals having electric dipoles, it is understood that the pyroelectric effect is produced because the distance between the dipoles changes by temperature. The pyroelectric effect is produced only in materials having a high electrical resistance. Electric charges are produced in the direction of dipoles (the Z direction in the LT crystal) at the crystal surface as a result of ionic displacement. In materials having a low electrical resistance, such electric charges come neutralized because of the electrical conductivity the crystal itself has. Then, in a usual transparent LT crystal, its volume resistivity is at the level of $10^{15}$ Ωcm as stated previously, and hence the pyroelectric effect develops remarkably.

However, in the lithium tantalate (LT) substrate according to the present invention, its volume resistivity is controlled within the range of from $10^{10}$ to $10^{13}$ Ωcm. Hence, the substrate has a very low pyroelectricity or no pyroelectricity, and it can be made colored and opaque from a colorless and transparent state and also sufficiently has the properties required as a piezoelectric material. Also, the colored and opaque tone of the lithium tantalate (LT) substrate according to the present invention looks dark brown through transmitted light, and looks black through reflected light. Accordingly, this phenomenon of being made colored and opaque is herein called "blackening".

As a practical method of judging whether or not the lithium tantalate (LT) substrate has no longer the pyroelectricity as the effect brought by the heat treatment described above, a heat cycle test is available which is conducted sumilating temperature changes the LT substrate undergoes in an actual process for fabricating surface acoustic wave devices. More specifically, where a heat cycle in which a sample is heated from room temperature to 200° C. at a rate of 10° C./minute and thereafter cooled to room temperature at a rate of 10° C./minute is applied to LT substrates, sparks are seen at the substrate surface in the case of LT substrates obtained by the conventional method. On the other hand, no spark is seen at the substrate surface in the case of blackened LT substrates. Accordingly, the judgement on whether or not the blackening has taken place is effective as a practical method for the judgement of LT substrates.

Incidentally, the blackening is clearly observable where the heat treatment is carried out for 4 hours or more, provided that, when viewed through transmitted light, the degree of coloring for the blackening is lower where the heat treatment is carried out in the atmosphere of an inert gas (such as nitrogen gas or argon gas) than where it is carried out in the atmosphere of vacuum, even though substrates have equal volume resistivities. A substrate treated in the atmosphere of vacuum is strongly colored at the substrate surface and the vicinity thereof. Thus, the oxygen hole density at the substrate surface and the vicinity thereof is presumed be high. The oxygen holes are also a sort of crystal defects (imperfections), and hence, in view of mechanical strength of the substrate, it is more desirable that the desired volume resistivity is attained by relatively thin coloring.

The present invention is described below in greater detail by giving Examples.

Example 1

Using a raw material having congruent composition, an LT single crystal of 4 inches in diameter was grown by the Czochralski method. The crystal was grown in an atmosphere of nitrogen-oxygen mixed gas of about 3% in oxygen concentration. An ingot of the crystal obtained was transparent and pale yellow.

This ingot of the crystal was subjected to heat treatment in order to remove thermal strain and to poling treatment so as to be single-polarized, followed by periphery grinding, slicing and polishing to obtain a material LT substrate with 36° RY (rotated Y axis). The material substrate obtained was colorless and transparent, and had a volume resistivity of $10^{15}$ Ωcm, a Curie temperature of 603° C. and a surface acoustic wave velocity of 4,150 m/second.

The material substrate obtained was buried in a mixed powder of 25% by weight of Al and 75% by weight of $Al_2O_3$ and then subjected to heat treatment at 350° C. for 20 hours in an atmosphere of nitrogen gas and under a reduced pressure of 500 Torr.

The substrate having been subjected to the heat treatment was opaque and dark reddish brown (transmittance of light of 365 nm in wavelength, in substrate: 68%) and had a volume resistivity of $7.50 \times 10^{12}$ Ωcm.

Incidentally, the light transmittance was measured with a spectrophotometer (U-3400) manufactured by Hitachi Ltd., and the volume resistivity was measured by the three-terminal method according to JIS K-6911.

Next, on the substrate having been subjected to the heat treatment, a heat cycle test was conducted in which the substrate was heated from room temperature to 200° C. at a rate of 10° C./minute and thereafter cooled to room temperature at a rate of 10° C./minute. As the result, no substrate potential came about and no phenomenon of sparking was seen at all.

Further, the substrate obtained had a Curie temperature of 603° C. and a surface acoustic wave velocity of 4,150 m/second. Thus, the values of physical properties influencing the surface acoustic wave device characteristics did not differ from those of the conventional product, the 36° RY substrate.

Example 2

The heat treatment was carried out under substantially the same conditions as those in Example 1 except that the heat treatment temperature was 550° C., to obtain a substrate which was opaque and dark reddish brown (transmittance of light of 365 nm in wavelength, in substrate: 65%) and had a volume resistivity of $1.80 \times 10^{11}$ Ωcm.

This substrate showed heat cycle test results like those in Example 1, and also had properties such as Curie temperature like those in Example 1.

Example 3

The heat treatment was carried out under substantially the same conditions as those in Example 1 except that the heat treatment temperature was 600° C., to obtain a substrate which was opaque and dark reddish brown (transmittance of light of 365 nm in wavelength, in substrate: 63%) and had a volume resistivity of $1.40 \times 10^{10}$ Ωcm.

This substrate also showed heat cycle test results like those in Example 1, and also had properties such as Curie temperature like those in Example 1.

Example 4

The heat treatment was carried out in the same manner as the treatment in Example 1 except that the material substrate was buried in a mixed powder of 10% by weight of Al and 90% by weight of $Al_2O_3$.

The substrate obtained was opaque and dark reddish brown (transmittance of light of 365 nm in wavelength, in substrate: 68%) and had a volume resistivity of $8.50 \times 10^{12}$ Ωcm.

This substrate also showed heat cycle test results like those in Example 1, and also had properties such as Curie temperature like those in Example 1.

Example 5

The heat treatment was carried out in the same manner as the treatment in Example 1 except that the material substrate was buried in a mixed powder of 10% by weight of Al and 90% by weight of $Al_2O_3$ and that the heat treatment temperature was set at 550° C.

The substrate obtained was opaque and dark reddish brown (transmittance of light of 365 nm in wavelength, in substrate: 65%) and had a volume resistivity of $2.00 \times 10^{11}$ Ωcm.

This substrate also showed heat cycle test results like those in Example 1, and also had properties such as Curie temperature like those in Example 1.

Example 6

The heat treatment was carried out in the same manner as the treatment in Example 1 except that the material substrate was buried in a mixed powder of 10% by weight of Al and 90% by weight of $Al_2O_3$ and that the heat treatment temperature was set at 600° C.

The substrate obtained was opaque and dark reddish brown (transmittance of light of 365 nm in wavelength, in substrate: 63%) and had a volume resistivity of $2.30 \times 10^{10}$ Ωcm.

This substrate also showed heat cycle test results like those in Example 1, and also had properties such as Curie temperature like those in Example 1.

Example 7

The heat treatment was carried out in the same manner as the treatment in Example 1 except that the material substrate was buried in a mixed powder of 50% by weight of Al and 50% by weight of $Al_2O_3$ and then subjected to heat treatment at 550° C. for 40 hours in an atmosphere of nitrogen gas and under atmospheric pressure.

The substrate obtained was opaque and dark reddish brown (transmittance of light of 365 nm in wavelength, in substrate: 68%) and had a volume resistivity of $2.30 \times 10^{12}$ Ωcm.

This substrate also showed heat cycle test results like those in Example 1, and also had properties such as Curie temperature like those in Example 1.

Example 8

The heat treatment was carried out in the same manner as the treatment in Example 1 except that it was carried out at 550° C. for 10 hours in an atmosphere of vacuum.

The substrate obtained was opaque and dark reddish brown (transmittance of light of 365 nm in wavelength, in substrate: 58%) and had a volume resistivity of $1.70 \times 10^{11}$ Ωcm.

This substrate also showed heat cycle test results like those in Example 1, and also had properties such as Curie temperature like those in Example 1.

Comparative Example 1

The heat treatment was carried out in the same manner as the treatment in Example 1 except that the material substrate was not buried in the mixed powder of Al and $Al_2O_3$ and subjected to heat treatment at 1,000° C. for 40 hours in an atmosphere of nitrogen gas and under atmospheric pressure.

The substrate obtained was colorless and transparent and was not seen to have been blackened (transmittance of light of 365 nm in wavelength, in substrate: 71%) and had a volume resistivity of 1 to $2 \times 10^{15}$ Ωcm.

On the substrate having been thus treated, a heat cycle test was conducted in which the substrate was heated from room temperature to 200° C. at a rate of 10° C./minute and thereafter cooled to room temperature at a rate of 10° C./minute. As the result, a phenomenon was seen in which vigorous sparking occurred on the substrate surface.

Comparative Examples 2 and 3

The heat treatment was carried out in the same manner as the treatment in Example 1 except that the material substrate was not buried in the mixed powder of Al and $Al_2O_3$ and then subjected to heat treatment at 800° C. (Comparative Example 2) or 480° C. (Comparative Example 3) for 40 hours in an atmosphere of nitrogen gas and under atmospheric pressure.

The substrates obtained were colorless and transparent and were not seen to have been blackened (transmittance of light of 365 nm in wavelength, in substrate: 72%) and had a volume resistivity of 1 to $2 \times 10^{15}$ Ωcm.

On each substrate having been thus treated, a heat cycle test was also conducted in which the substrate was heated from room temperature to 200° C. at a rate of 10° C./minute and thereafter cooled to room temperature at a rate of 10° C./minute. As the result, a phenomenon was seen in which vigorous sparking occurred on the substrate surface.

POSSIBILITY OF INDUSTRIAL APPLICATION

As described above, in the lithium tantalate (LT) substrate according to the present invention, its volume resistivity is controlled within the range of from $10^{10}$ to $10^{13}$ Ωcm. Hence, the substrate has a very low pyroelectricity or no pyroelectricity, and it can be made colored and opaque from a colorless and transparent state and also sufficiently has the properties required as a piezoelectric material. Therefore, it no longer comes about that, because of sparks generated when the substrate surface is charged up due to temperature changes undergone during the process of fabricating a surface acoustic wave device or the like, patterns formed on the substrate surface are destroyed and further the substrate is broken. It also no longer comes about that the light transmitted through the interior of the substrate in the step of photolithography reflects from the back of the substrate and returns to the surface to make poor the resolution of the patterns formed. Thus, this substrate is suited to be used in substrates for surface acoustic wave devices.

The invention claimed is:

1. A process for manufacturing a lithium tantalate substrate by using a lithium tantalate crystal grown by the Czochralski method, wherein;
    a lithium tantalate crystal grown by the Czochralski method and worked in the state of a substrate is buried in a mixed powder of 25% by weight of Al and 75% by weight of $Al_2O_3$, followed by heat treatment carried out at a temperature kept from 350 to 600° C. for 20 hours in an atmosphere of nitrogen gas and under reduced pressure, to manufacture a lithium tantalate substrate having volume resistivity which has been controlled within the range of from $10^{10}$ to $10^{13}$ Ωcm.

2. A process for manufacturing a lithium tantalate substrate by using a lithium tantalate crystal grown by the Czochralski method, wherein;

a lithium tantalate crystal grown by the Czochralski method and worked in the state of a substrate is buried in a mixed powder of 10% by weight of Al and 90% by weight of $Al_2O_3$, followed by heat treatment carried out at a temperature kept from 350 to 600° C. for 20 hours in an atmosphere of nitrogen gas and under reduced pressure, to manufacture a lithium tantalate substrate having volume resistivity which has been controlled within the range of from $10^{10}$ to $10^{13}$ Ωcm.

3. A process for manufacturing a lithium tantalate substrate by using a lithium tantalate crystal grown by the Czochralski method, wherein;

a lithium tantalate crystal grown by the Czochralski method and worked in the state of a substrate is buried in a mixed powder of 50% by weight of Al and 50% by weight of $Al_2O_3$, followed by heat treatment carried out at a temperature of 550° C. for 40 hours in an atmosphere of nitrogen gas and under atmospheric pressure, to manufacture a lithium tantalate substrate having volume resistivity which has been controlled within the range of from $10^{10}$ to $10^{13}$ Ωcm.

4. A process for manufacturing a lithium tantalate substrate by using a lithium tantalate crystal grown by the Czochralski method, wherein;

a lithium tantalate crystal grown by the Czochralski method and worked in the state of a substrate is buried in a mixed powder of 25% by weight of Al and 75% by weight of $Al_2O_3$, followed by heat treatment carried out at a temperature of 550° C. for 10 hours in an atmosphere of vacuum, to manufacture a lithium tantalate substrate having volume resistivity which has been controlled within the range of from $10^{10}$ to $10^{13}$ Ωcm.

* * * * *